United States Patent [19]

Avanzino et al.

[11] Patent Number: 5,776,834
[45] Date of Patent: Jul. 7, 1998

[54] BIAS PLASMA DEPOSITION FOR SELECTIVE LOW DIELECTRIC INSULATION

[75] Inventors: Steven Avanzino, Cupertino; Darrell M. Erb, Los Altos; Robin Cheung, Cupertino; Rich Klein, Mountain View; Pervaiz Sultan, San Jose, all of Calif.

[73] Assignee: Advanced Micro Devices, Inc., Sunnyvale, Calif.

[21] Appl. No.: 478,315

[22] Filed: Jun. 7, 1995

[51] Int. Cl.[6] .................................................. H01L 21/471
[52] U.S. Cl. .......................... 438/692; 438/732; 438/733; 438/787; 438/788
[58] Field of Search ............................... 437/195, 187, 437/228 SD, 231, 235, 236; 148/50, 51, 73; 427/255.1, 255.3; 156/653.1; 438/692, 732, 733, 787, 788, 619

[56] References Cited

U.S. PATENT DOCUMENTS

| | | | |
|---|---|---|---|
| 5,124,014 | 6/1994 | Foo et al. | 204/192 |
| 5,275,977 | 1/1994 | Otsubo et al. | 437/235 |
| 5,290,358 | 3/1994 | Ruliloff et al. | 118/715 |
| 5,302,233 | 4/1994 | Kim et al. | 156/636 |
| 5,407,860 | 4/1995 | Stoltz et al. | 437/180 |
| 5,494,853 | 2/1996 | Lur | 437/195 |

Primary Examiner—Jey Tsai
Assistant Examiner—C. Everhart
Attorney, Agent, or Firm—Foley & Lardner

[57] ABSTRACT

A method of forming low dielectric insulation between those pairs of conductive lines, of a level of interconnection for integrated circuits, having a gap of about 0.5 microns or less by depositing a nonconformal source with a poor step function for the insulating material, such as silane ($SiH_4$) as the silicon (Si) source for silicon dioxide ($SiO_2$), so as to create, in the gap, a large void whose dielectric constant is slightly greater than 1. After the formation of the void in the 0.5 microns or less gaps, the deposited nonconformal material is etched either simultaneously or sequentially along with deposition to fill the remaining gaps with void free insulation. The surface of the deposited insulating material is planarized at the desired thickness. Alternatively, a thin conformal insulating layer is first deposited as a liner on the conductive lines. The resulting structure of the interconnection level comprises a layer of insulation between and on the conductive lines with the dielectric constant of the insulation between the pairs of conductive lines with gap of 0.5 or less being, in combination with the void, at least about 3 or lower, and all of the remaining gaps are filled with void free insulating material with a dielectric constant of greater than about 3.5.

10 Claims, 3 Drawing Sheets

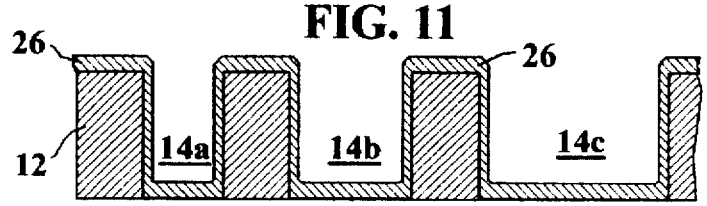
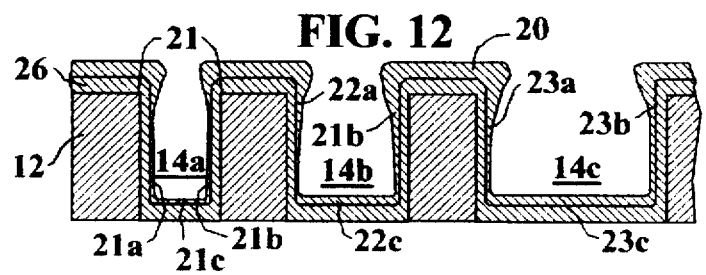
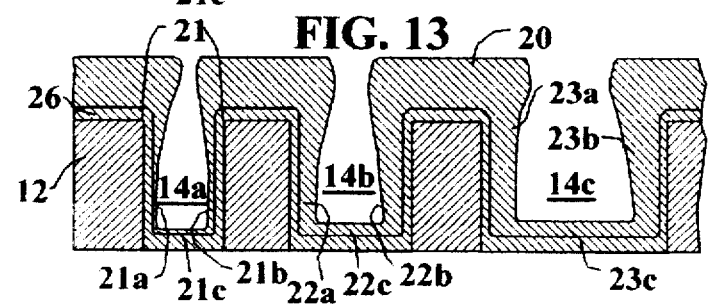
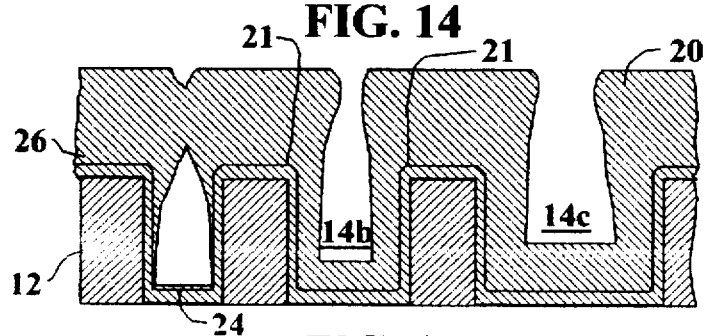
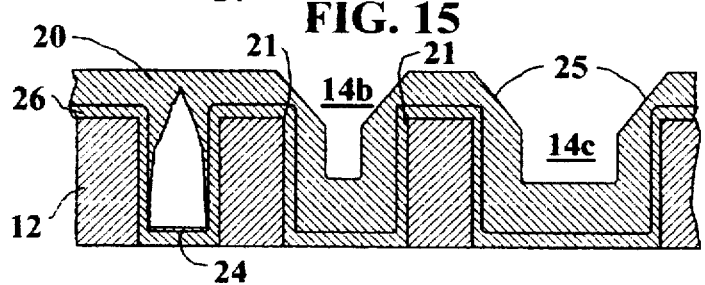
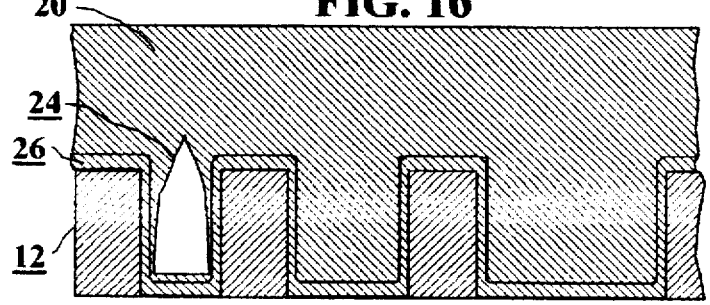

BIAS PLASMA DEPOSITION FOR SELECTIVE LOW DIELECTRIC INSULATION

CROSS REFERENCES TO RELATED APPLICATIONS

This application is related to U.S. patent application Ser. No. 08/481,906, entitled Uniform Nonconformal Deposition for Forming Low Dielectric Constant Insulation Between Certain Conductive Lines, filed on an even date herewith; and U.S. patent application Ser. No. 08/481,030, entitled Composite Insulation With a Dielectric Constant of Less Than 3 in a Narrow Space Separating Conductive Lines also filed on an even date herewith.

BACKGROUND OF THE INVENTION

This invention relates to the fabrication of integrated circuits semiconductor devices and, more particularly, to forming an insulating layer on and between metal conductive lines which provide an interconnection between the active and/or passive elements of the integrated circuit.

In very large scale integrated (VLSI) circuit devices, several wiring layers are required to connect together the active and/or passive elements in a VLSI semiconductor chip. The interconnection structure consists of thin conductive lines separated by insulation in one layer or level and connected through vias or studs from contacts of the elements of the semiconductor chip or to a similar layer in another level of interconnections. This interconnection structure is similar to a transmission line in that there is a propagation delay of the signals being transmitted in these wiring layers. The delay is referred to as RC delay because it is a result of the resistance (R) of the material of the wire and the capacitance (C) between adjacent wires. With the trend of higher and higher levels of integration in semiconductor devices to ultra large scale integrated (ULSI) circuits, the space or gap between the wires or conductive lines to be filled with insulation is becoming extremely narrow between some of the conductive lines, such as about 0.5 microns and smaller. Such a narrow space or gap between conductive lines increases the capacitance and places greater demands on the insulating properties of the insulation between the conductive lines. Capacitance (C) is the product of dielectric constant (DC) of the insulating material times the area (A) of the opposing faces of the conductive line divided by the distance (D) between the conductive lines. With a decrease in distance (D), the capacitance (C) increases. Since signal delay of signal transmitted on the conductive line is controlled by the RC constant, an increase in capacitance (C) degrades the performance of the integrated circuit.

At the present state of the art, the insulating material used to fill these gaps is a silicon compound, such as silicon dioxide, which has a dielectric constant (DC) of between 3.5 and 4.0. A vacuum has a perfect dielectric constant (DC) and is the basis for the measurement of the dielectric constant of other materials. For example, air and other insulating gases have a dielectric constant (DC) of slightly greater than 1, but less than 1.1. Air has a dielectric constant of 1.00059 and oxygen ($O_2$) has a dielectric constant of 1.000523. The use of insulating material with dielectric constants (DC) lower than 3.5 in the narrow gap will lower the capacitance (C) and offset the increase caused by the smaller distance (D) between adjacent conductive lines. Attempts have been made to use organic insulating materials, such as polyimides which have a DC of between 3.2–3.4, but are hydroscopic and any absorbed moisture can potentially cause corrosion of metal lines. Other possible insulating materials are boron nitride ($BN_x$) and fluorinated silicon oxide ($SiO_xF_y$), but they also have dielectric constants above 3.

In addition to the demands placed on the insulating property of the insulation between the conductive lines, these narrow gaps of about 0.5 microns and smaller make it much more difficult to deposit the insulating material into the gaps so that the gaps may not be completely and properly filled. In addition, when the height of the conductive line is increased, it makes it more difficult to fill, especially when the aspect ratio is 2 to 1 or greater with a gap distance of 0.5 microns or smaller. Aspect ratio is the height (h) of the conductive line divided by the distance (d) or gap between the conductive lines. It is pointed out in U.S. Pat. No. 5,124,014 to Pang-Dow Foo et al. that when the gap or distance (d) is less than the height (h) of the conductive line, it is difficult to fill uniformly. This patent states that the top tends to accumulate deposited material, growing shoulders that may eventually close off before the bottom is filled, leading to the formation of voids in the deposited material. U.S. Pat. No. 5,275,977 to Otsubo et al. confirms this problem and sets the same objective for their process as Pang-Dow Foo et al. set for theirs; namely, the formation of the insulating film free of voids. This patent discloses the combination of chemical vapor deposition (CVD) and etching a silicon dioxide film ($SiO_2$) using tetraethylorthosilicate (TEOS) $[Si(OC_2H_5)_4]$ as the source silicon gas and oxygen ($O_2$) for deposition of $SiO_2$ and carbon tetrafluoride ($CF_4$) as the etching gas. With TEOS as the source gas, the deposited $SiO_2$ films are conformal in that the deposition follows the contour of the surface on which it is being deposited. This patent also suggests the use of other source gases, one of which is silane ($SiH_4$). However, other than this suggestion, no description is given for forming an insulating layer between and on the conductive lines with $SiH_4$ as the source. The Pang-Dow Foo et al. patent describes the use of an electron cyclotron resonance (ECR) plasma reactor, which can be operated to both deposit and sputter etch either simultaneously or sequentially, to deposit high quality silicon dioxide layers which are void-free. The deposition of $SiO_2$ occurs in a vertical direction while the sputtering is angle dependent with its highest yield being at 45°. Instead of $SiH_4$, either TEOS or tetramethylcyclosiloxane (TMCTS) is used as the silicon containing source gases. Both of these source gases produce conformal films. This patent states that as the aspect ratio approaches and exceeds unity, it becomes more difficult to deposit void-free oxide. To prevent voids in the insulating layer in filling these narrow gaps, the bias potential is increased to induce a greater amount of sputter etching. Alternatively, a separate etching step may be performed.

One advantage of using ECR plasma deposition is that the substrate does not have to be heated to more than 150 degrees C. Above about 400 degrees C, hillocks tend to form in the aluminum conductive lines and, if the growth is lateral, it could bridge the narrow gap between lines and create a short. Other plasma apparatus that can perform deposition and etching and operate at low substrate temperatures are a transformer coupled plasma (TCP) reactor and a helicon coupled plasma (HCP) reactor.

The description in the specification of both of these patents describes methods for forming void-free insulating layers between the conductive lines and they teach that, from a detrimental standpoint, voids will form in the narrow gaps under certain conditions.

SUMMARY OF THE INVENTION

It is an object of the present invention to provide a method for forming insulating layers on and between metal conductive lines such that the insulation in the narrow gaps between conductive lines has an improved dielectric constant.

Another object of the present invention is to provide a method for filling the narrow gaps between conductive lines with an insulating layer that has an effective dielectric constant lower than the dielectric constant of the other wider gaps between the conductive lines.

In accordance with the invention, silicon containing insulating material is deposited with nonconform step coverage on a patterned surface of metal conductive lines with at least some number having narrow gaps between them in a reactor having the capability of both depositing and etching the material under conditions to form a large closed void uniformly in each of the narrow gaps with similar dimensions, with at least one-third of the volume of the gap being filled with the void so that the effective dielectric constant of the combined insulating material and the void is at about or below 3. In nonconformal step coverage, the deposition rate is proportional to the arrival angle of reactants being deposited. Along the top horizontal surface of the conductive lines, the reactants arrive from many angles varying from 0° to 180° while reactants at the top or shoulder of the vertical walls of the conductive lines arrive from angles varying from 0° to 90°. Further down the wall within the gap, the angle of arrival is dependent on height (H) of the wall and the width (W) or distance of the gap between conductive lines and is proportional to arctan W/H. During deposition, due to nonconformal step coverage of the plasma reactants, only a thin layer of insulating material is formed on the vertical walls of the conductive lines while the material on the top and shoulders of the conductive lines is initially formed twice as thick. As its grows at this rate, it reduces the width (W) of the gap at the top of the conductive lines which, in turn, continues to reduce the deposition on the vertical walls until finally it bridges across the gap at the top. After the bridge has formed across the narrow gaps and closed the voids with a layer of insulating material, the bias voltage is now applied to the substrate to sputter etch the insulation in the other gaps during deposition sufficient to cause a leveling of the insulating material in those other gaps and remove the shoulders on their adjacent conductive lines, but not remove the bridge of insulating material closing the voids in the narrow gaps. Accordingly, with this method, the narrow gaps equal to or less than 0.5 microns and with an aspect ratio of at least 2 to 1 are formed with closed voids in the gaps, with about at least one-third of the volume of the gap consisting of the void. Although silicon containing gases which form conformal layers could be used under more exacting conditions, it is preferred to use silicon containing gases which form nonconformal layers, such as silane (SiH$_4$). By using silicon containing gases which form nonconformal layers, it is possible to maximize the size of the void in the narrow gap and thereby minimize the effective dielectric constant of the resultant void and insulating material in the gap and thereby lower the capacitance and the RC delay.

However, in accordance with another aspect of the present invention, a thin conformal layer is first deposited on the conductive lines so as to augment the subsequent thin nonconformal layer on the vertical walls as a barrier against the protrusion of hillocks into the narrow gap.

For an integrated circuit semiconductor device having a semiconductor body with a plurality of active devices and multilevel interconnections disposed on a semiconductor body, the above process results in a novel structure comprising, between the conductive lines with a narrow gap of not greater than 0.5 microns and having walls with an aspect ratio of not less than 2 relative to said gap, a nonconformal insulating material, with a dielectric constant of not less than 3.5, adjacent and at least partially covering each of the walls of the conductive lines and enclosing a void, with a dielectric constant of slightly greater than 1, in the gap. The void is of such a size that the resultant dielectric constant of the insulating material and the void in the narrow gap is not greater than 3, thereby reducing the RC delay of the metal conductive lines and improving the performance of the semiconductor device.

In an alternative embodiment, the walls of the conductive lines may be coated with a thin layer of conformal insulating material also with a dielectric constant of not less than 3.5. This thin layer is a barrier to hillocks when the metal of conductive lines is aluminum. Preferably, the thickness of the thin layer is not greater than 500 Å. In both embodiments, the size of the void is at least one-third of the volume in the narrow gap.

It should be noted that the above described prior art patents fail to teach a method for forming a large closed void uniformly in each of the narrow gaps between the conductive lines. These patents further fail to recognize and even teach away from the performance advantage that can be gained by such a large void in a narrow gap.

BRIEF DESCRIPTION OF THE DRAWINGS

The foregoing and other objects, aspects and advantages will be better understood from the following detailed description of a preferred embodiments of the invention with reference in the drawings, in which:

FIGS. 11, 12, 13, 14, 15 and 16 are enlarged cross-sectional views of the same section of FIG. 2 as in FIG. 3 showing early, intermediate and final stages of another embodiment of the present invention.

DETAILED DESCRIPTION OF THE PREFERRED EMBODIMENTS OF THE INVENTION

Figure 1:
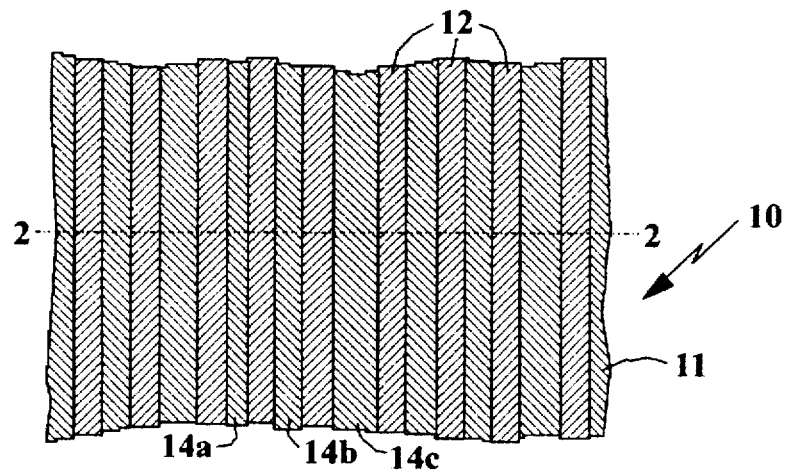
FIG. 1 is a plan view of a portion of a VLSI integrated circuit metallization layer during fabrication of a semiconductor chip prior to being covered with a layer of insulating material.
Figure 2:
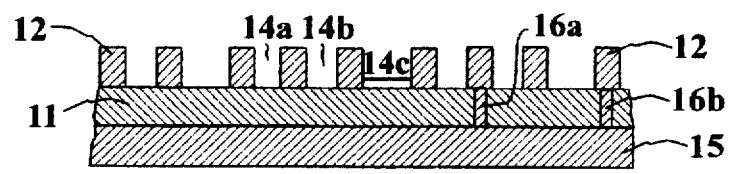
FIG. 2 is a cross-sectional view of the metallization layer taken along 2—2 of FIG. 1.
Figure 3:
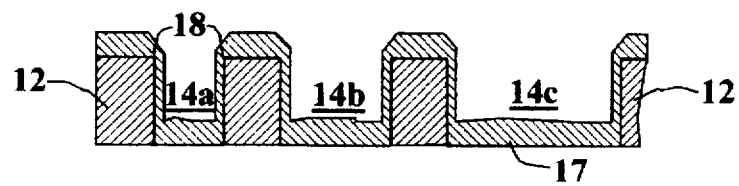
FIGS. 3, 4 and 5 are enlarged cross-sectional views of a section of FIG. 2 as indicated by vertical lines 3—3 and 3a—3a showing early, intermediate and final stages of a prior art method for coating an insulating layer on the metallization layer.
Figure 4:
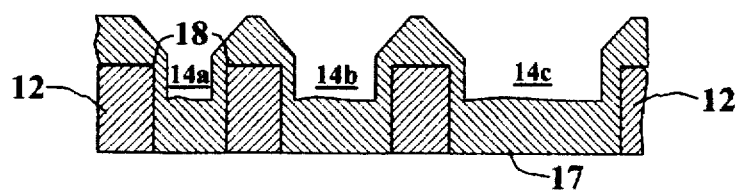
Figure 5:
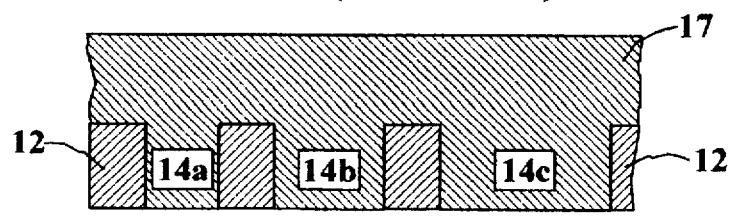

Referring now to the drawings and, more particularly to FIGS. 1 and 2, a portion of a partially complete metallization layer 10 is shown disposed on an insulating layer 11 and with a plurality of conductive lines 12 having narrow gaps or openings 14a, intermediate gaps 14b and wide gaps 14c between the conductive lines. A cross-section of this metallization layer 10 is shown in FIG. 2 and it includes a conductive line 15 in the underlying metallization layer with vias 16a and 16b connecting that conductive line with two of the lines of the metallization layer 10. An insulating material must be deposited in the gaps or openings 14 as shown in FIGS. 1 and 2 to complete the metallization layer 10. Heretofore, this was accomplished by chemical vapor deposition (CVD) of precursors of the insulating material, such as silane ($SiH_4$) and oxygen ($O_2$). Because of smaller gaps, such as 0.5 microns or less, between the conductive lines 12 and the possible formation of small voids in filling such narrow gaps, a present method uses the combination of simultaneously depositing and etching the insulating material to fill all of the gaps without any small voids. This method is shown in FIGS. 3, 4 and 5 at early, intermediate, and near final stages of filling the gaps 14a, 14b and 14c, respectively, between conductive lines 12 with a conformal insulating material 17, such as when the source of silicon is tetraethylorthosilicate (TEOS) or tetramethylcyclotetrasilane (TMCTS) to react with $O_2$. Either a single chamber plasma reactor or a dual chamber, such as an Electron Cyclotron Resonance (ECR) reactor are used to simultaneously deposit $SiO_2$ and etch the deposited $SiO_2$ with either $O_2$ or Argon (Ar) providing ions for sputter etching or an etching gas, such as carbon tetrafluoride ($CF_4$) for chemical etching. In the prior method using an ECR reactor, a conformal $SiO_2$ layer is deposited anisotropically or unidirectionally parallel to the sidewalls of the conductive lines 12 so as to minimize any buildup of the deposited $SiO_2$ on the shoulders 18 of the conductive lines as best shown in FIGS. 3. In addition, the deposited $SiO_2$ is etched at approximately a 45° angle during deposition, which causes the shoulders 18 to take on a sloped appearance as shown in FIGS. 3–5 and further reduces any possibility of deposited $SiO_2$ bridging over the gaps or openings 14a, 14b and 14c to create a void. Thus, the combination of conformal source material for the insulating layer, undirectional deposition, and sputter or chemical etching provides void free insulation between and on top of the conductive lines 12. The dielectric constant of the insulation between the conductive lines is the sole dielectric constant of the deposited insulating material and, since it is $SiO_2$, the dielectric constant of the prior art insulating material between the narrow gap 14a is in the range of 3.5 to 4.

In accordance with the present invention, it has been discovered that a large void is not detrimental in filling a narrow gap or opening 14a because the void has a lower dielectric constant than any of the solid inorganic insulating materials, such as $SiO_2$, or even organic insulating materials, such as polyimide, and the combination of the solid insulating material and a void of the proper size and position yields a dielectric constant of at least about 3 and lower. The void in a gap or opening of 0.5 microns or less with an aspect ratio of about 2 to 1 or greater relative to the conductive line's height provides a substantial improvement in the capacitance of the gap and thereby the RC delay of the conductive lines 12a and 12b on either side of the gap 14a.

A method for achieving a void of the proper size and position is shown sequentially in FIGS. 6, 7, 8, 9 and 10. The source for an insulating material 20, herein $SiO_2$, is an essentially nonconformal source material and, for depositing $SiO_2$, is silane ($SiH_4$) or fluorinated silane ($SiH_xF_y$) as the source for Si, and a source for oxygen is $O_2$ or $N_2O$, and herein is $SiH_4$ and $O_2$ using an ECR reactor. The use of a nonconformal source material 20 results in poor "step coverage". Step coverage, a measure of how well a film maintains its nominal thickness, is expressed by the ratio of the minimum thickness of a film as it crosses a step, $t_S$, to the nominal thickness of the film on horizontal regions, $t_n$, and it is expressed as the percentage of the nominal thickness that occurs at the step:

Step coverage (%)=$(t_s/t_n)$×100

Figure 6:
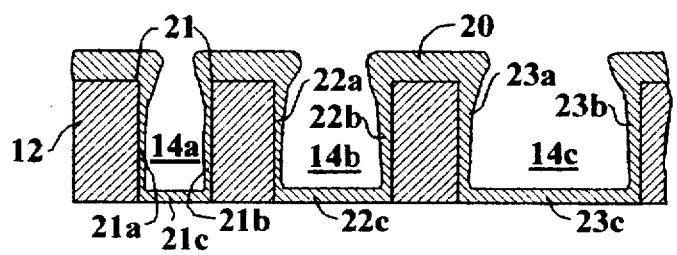
FIGS. 6, 7, 8, 9 and 10 are enlarged cross-sectional views of the same section of FIG. 2 as in FIG. 3 showing early, intermediate and final stages of the method of the present invention for coating an insulating layer on the metallization layer.
Figure 7:
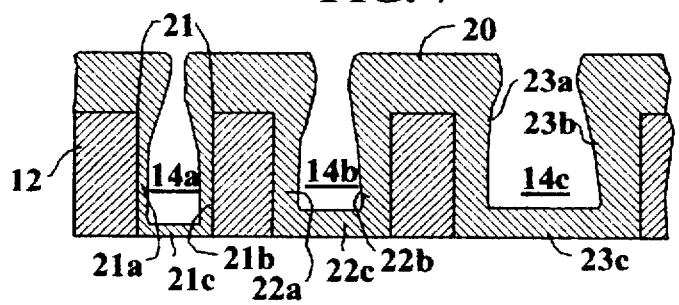
Figure 8:
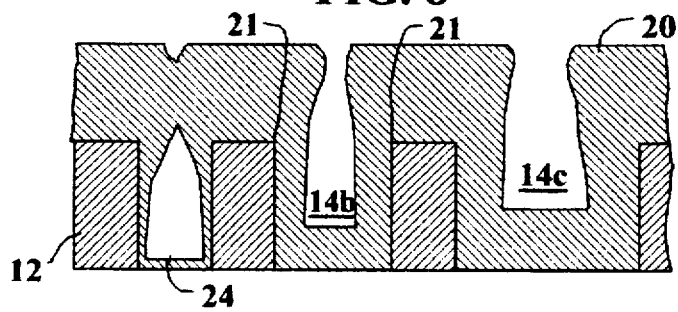
Figure 9:
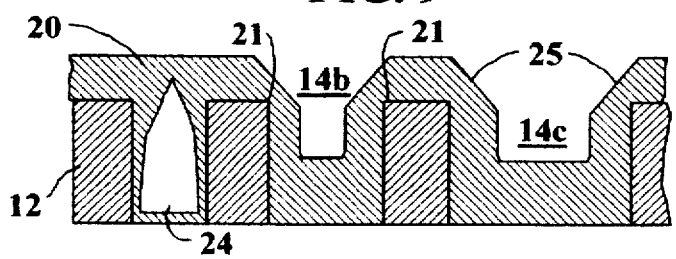
Figure 10:
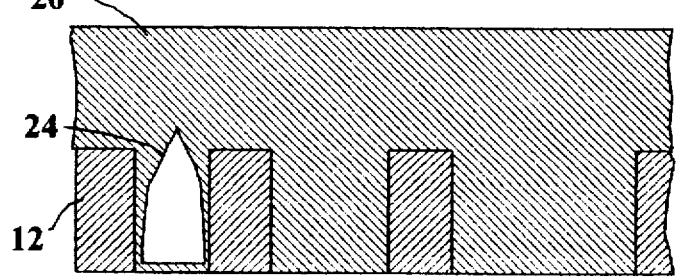

With a step coverage of less than 50%, the deposited $SiO_2$ forms a thick layer on the top or shoulders 21 of conductive lines 12, herein about 0.8 to 1.0μ in height but, in the narrow gap or opening 14a only thin sidewalls 21a and 21b of about 500 Å each in thickness and a thin bottom layer 21c of slightly greater than 500 Å is deposited. In the intermediate gap or opening 14b, substantially thicker sidewalls 22a and 22b and a thick bottom layer 22c is formed. Even thicker sidewalls 23a and 23b and bottom layer 23c are formed in the wide gap or opening 14c. The relative thicknesses of the three gaps 14a–c are shown in FIG. 6. As the deposition continues, the nonconformal characteristic of the deposition causes the top or shoulders 20 to grow thicker until at the narrow gap or opening 14a, the shoulders almost bridge together as shown in FIG. 7. Because of the restricted space between the shoulders 20, the sidewalls 21a and 21b and the bottom layer 21c only slightly increase in thickness as shown in FIG. 7. With continued deposition in a nonconformal manner with a step coverage of not greater than about 10 to 20%, the shoulders 20 of the narrow gap 14a finally bridge over and create a void between the two conductive lines 12 positioned essentially below the tops of the conductive lines as shown in FIG. 8, where it will have the greatest impact on lowering the dielectric constant of the insulation between the conductive lines 12 on opposite sides of the narrow gap 14a. If the deposition continued in this nonconformal manner, the shoulders of the intermediate gap 14b, as shown in FIG. 8, also would bridge over and form a void at a position at least half-way up the conductive lines 12 and thereby would not contribute substantially to lowering the dielectric constant of the insulation between the intermediate gap 14b. According to one aspect of the present invention, the deposited insulating layer 20 is etched back either by sputter etching or by chemical etching and herein is sputter etched using argon (Ar) as the etching gas in the ECR reactor. The sputter etching is most effective at about a 45° angle. Since the shoulders 21 of the insulating layer 20 are in a range including 45° to the direction of the sputtering ions, the shoulders 21 receive the greatest etching and are converted to a positive slope 25. This permits further deposition of the insulating material 20, herein $SiO_2$, in the gaps or openings 14b and 14c as shown in FIG. 9. With continued deposition and sputter etching, the gaps 14b and 14c are filled without voids and the conductive lines are capped with the insulating material. As a final step, the insulating surface of the deposited insulating material is planarized back by a suitable technique such as chem/mech polishing, as shown in FIG. 10. In the present instant, the thickness of the completely deposited insulating layer 20 is about 0.8 to 1.2μ above the conductive lines.

As a specific example of the operating conditions for depositing $SiO_2$ in the narrow gaps 14a for a creating voids 24, in other than narrow gaps for filling without voids, and for capping the conductive lines 12 using a high density plasma reactor, herein ECR, with a wafer supported on an rf biased electrode, three different operating conditions are used with plasma gases of $SiH_4$, $O_2$ and Ar. Initially, to create the void 24 in the narrow gap 14a, the power is 1200 watts (W) with an rf bias of 200–600 W and the Ar/$O_2$/$SiH_4$ ratio is 1.5/1.4–2.0/1.0. Next, once the void 24 is created and covered, the rf bias is changed to 1200–2000 W with the power and ratio remaining the same. In the capping deposition, the rf bias turned off and only $O_2$ and $SiH_4$ are utilized in a ratio of 1.4–2.0/1.0.

In accordance with another aspect of the present invention, a thin conformal insulating layer 26 is first deposited on the conductive lines 12 as shown in FIG. 11. As previously highlighted in the Background of the Invention, high temperature processing, above about 400° C., in the fabrication of semiconductor devices causes hillocks or protrusions to grow out of aluminum when it is used as the material for the conductive lines. As a safeguard against hillocks in this aspect of the invention, the thin conformal insulating layer 26 of about 500 Å thickness on the sidewalls is deposited, herein using TEOS as the source of conformal $SiO_2$ in a ECR reactor. A conformal material is used to assure that a uniform insulating layer of sufficient thickness, such as 500 Å, coats the sidewalls 12a and 12b of the opposing conductive lines 12 on either side of the narrow gap 14a. Because the subsequent nonconformal insulating layer 20 has such poor step coverage, the layer 20 may not completely coat the sidewalls 12a and 12b. Herein again, the source for the nonconformal insulating layer 20 is $SiH_4$ as the source for Si, with a source for oxygen being $O_2$ and nonconformal $SiO_2$ is deposited using an ECR reactor. Again with an initial step coverage of less than 50%, the deposited $SiO_2$ forms a thick layer on the conformal insulating layer 26 at the top or shoulders 21 of conductive lines 12 but only thin sidewalls 21a and 21b and a thin bottom layer 21c in the narrow gap or opening 14a and slightly thicker sidewalls 22a and 22b and bottom layer 22c in the intermediate gap or opening 14b and even thicker sidewalls 23a and 23b and bottom layer 23c in the wide gap or opening 14c as shown in FIG. 12. As the deposition continues, the nonconformal characteristic of the deposition causes the top or shoulders 20 to grow thicker until at the narrow gap or opening 14a, they almost bridge together as shown in FIG. 13. Because of the restricted space between the shoulders 20, the sidewalls 21a and 21b and the bottom layer 21c only slightly increase in thickness as shown in FIG. 13. With continued deposition in a nonconformal manner with a step coverage of not greater than 10 to 20%, the shoulders 20 of the narrow gap 14a finally bridge over and create a void between the two conductive lines 12 positioned essentially below the tops of the conductive lines as shown in FIG. 14, where it will have the greatest impact on lowering the dielectric constant of the insulation between the conductive lines 12 on opposite sides of the narrow gap 14a. If the deposition continued in this nonconformal manner, the shoulders of the intermediate gap 14b, as shown in FIG. 14, also would bridge over and form a void at a position at least half-way up the conductive lines 12 and thereby would not contribute substantially to lowering the dielectric constant of the insulation between the intermediate gap 14b. According to one aspect of the present invention, the deposited insulting layer 20 is etched back either by sputter etching or by chemical etching and herein is sputter etched using argon (Ar) as the etching gas in the ECR reactor. The sputter etching occurs at about a 45° angle, which etches away insulating layer 20 at the shoulders 21 to create a positive slope 25 to permit deposition of the insulating material, herein $Si_2$, in the gaps or openings 14b and 14c as shown in FIG. 15. With continued deposition and sputter etching, the gaps 14b and 14c are filled without voids and subsequently planarized by a suitable known technique, such as chem/mech polish, as shown in FIG. 16, with the thickness of the insulating layers of the conformal and nonconformal materials being about 0.8 to 1.2μ above the conductive lines.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention.

We claim:

1. A method of depositing silicon containing insulating material on a patterned surface of conductive lines separated by gaps on a substrate, with at least a pair of said conductive lines with opposing walls having a narrow gap of 0.5 microns or less between said walls and with an aspect ratio of about 2 to 1 or greater, comprising the steps of:

depositing a nonconformal silicon containing insulating material between the walls of the conductive lines under conditions to provide a poor step function between the bottom of the gap and the top of the conductive lines so that the material forms shoulders on the tops the conductive lines and bridges said conductive lines with a gap of about 0.5 microns or less, thereby forming a relatively large void in said narrow gap with the resultant insulating material in the narrow gap having a effective dielectric constant of less than about 3 and covered by a nonconformal silicon insulating layer;

etching said deposited insulating material at a time after the formation of the void in the narrow gap to remove said shoulders of insulating material between conductive lines of a size greater than about 0.5 microns but leave the insulating layer covering said void in the narrow gap; and depositing an insulating material to fill said gaps of a size greater than about 0.5 microns and complete the insulating layer between and over the conductive lines.

2. The method of claim 1 wherein said conductive lines are either aluminum or an aluminum alloy and a thin conformal layer of not greater than 500 Å is deposited before the nonconformal insulating material is deposited.

3. The method of claim 1 wherein the etching of said deposited insulating material is simultaneous with the deposition.

4. The method of claim 1 wherein the etching of said deposited insulating material is sequential and interdispersed with the deposition.

5. The method of claim 3 wherein the deposited insulating material is sputtered etched.

6. The method of claim 4 wherein the deposited insulating material is chemically etched from a plasma.

7. The method of claim 1 wherein the silicon source of the nonconformal insulating material is silane.

8. The method of claim 1 wherein the initial step coverage is less than 50%.

9. The method of claim 1 wherein, during the formation of said void, the step coverage is not greater than about 20%.

10. The method of claim 1 wherein the conductive lines include at least a pair of conductive lines with opposing walls having a gap greater than 0.5 microns and wherein said relative large void is formed in said narrow gap of 0.5 microns or less with the insulation having an effective dielectric constant of less than about 3 and said gap of greater than 0.5 microns is filled with insulating material without a void and with a dielectric constant of greater than about 3.

* * * * *